US010454245B1

(12) United States Patent
Tsung et al.

(10) Patent No.: US 10,454,245 B1
(45) Date of Patent: Oct. 22, 2019

(54) LASER DIODE CONTROL CIRCUIT WITH RECTIFIER IN FEEDBACK CONTROL LOOP

(71) Applicant: Realtek Semiconductor Corp., Hsinchu (TW)

(72) Inventors: Kuan-Chang Tsung, Hsinchu County (TW); Jian-Ru Lin, Nantou County (TW); Chia-Liang Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/124,427

(22) Filed: Sep. 7, 2018

(51) Int. Cl.
*H01S 5/062* (2006.01)
*H01S 5/068* (2006.01)
*H01S 5/042* (2006.01)
*H01S 5/0683* (2006.01)

(52) U.S. Cl.
CPC .............. *H01S 5/042* (2013.01); *H01S 5/068* (2013.01); *H01S 5/06213* (2013.01); *H01S 5/06223* (2013.01); *H01S 5/06808* (2013.01); *H01S 5/06812* (2013.01); *H01S 5/06832* (2013.01)

(58) Field of Classification Search
CPC .. H01S 5/068; H01S 5/06812; H01S 5/06808; H01S 5/06223; H01S 5/06832; H01S 5/06213
See application file for complete search history.

(56) References Cited

U.S. PATENT DOCUMENTS

| 7,504,610 B2 | 3/2009 | Draper |
| 7,724,792 B2 | 5/2010 | Neron et al. |
| 8,548,336 B2 | 10/2013 | Nuttgens |
| 2017/0288369 A1 | 10/2017 | Ikram et al. |

*Primary Examiner* — M. A. Golub-Miller
(74) *Attorney, Agent, or Firm* — Birch, Stewart, Kolasch & Birch, LLP

(57) ABSTRACT

A laser diode control circuit includes: a LD driver circuit for driving a laser diode; a direct current component remover circuit for generating a feedback signal based on a detected signal; a first conversion and filter circuit for generating a first filtered signal based on the feedback signal; a first rectifier for rectifying the first filtered signal to generate a first rectified signal; a reference signal generator for generating a reference signal; a second conversion and filter circuit for generating a second filtered signal based on the reference signal; a second rectifier for rectifying the second filtered signal to generate a second rectified signal; a rectified signals processing circuit for generating a processed signal based on the first and second rectified signals; and a comparator for generating a comparison signal based on the processed signal.

7 Claims, 3 Drawing Sheets

LASER DIODE CONTROL CIRCUIT WITH RECTIFIER IN FEEDBACK CONTROL LOOP

BACKGROUND

The disclosure generally relates to a laser diode control circuit and, more particularly, to a laser diode control circuit with rectifiers in the feedback control loop.

A laser diode is the key component in an optical communication system. The laser diode is employed to transmit modulated light pulses carrying data information to the receiving device through an optical fiber or other optical transmission medium.

However, the output light density versus input current characteristic curve (a.k.a. the L-I curve) of the laser diode varies with aging or temperature changes. Without proper control of the input current of the laser diode, the data quality and throughput of the optical communication system will degrade significantly.

SUMMARY

An example embodiment of a laser diode control circuit is disclosed, comprising: a LD driver circuit arranged to operably generate a driving signal for driving a laser diode based on a data signal; a direct current component remover circuit arranged to operably remove DC components from a detected signal to generate a feedback signal, wherein the detected signal is generated by an optical detection circuit and proportional to an amount of light generated by the laser diode; a first conversion and filter circuit arranged to operably conduct a current-to-voltage conversion and filtering operation on the feedback signal to generate a first filtered signal; a first rectifier arranged to operably rectify the first filtered signal to generate a first rectified signal; a reference signal generator arranged to operably generate a reference signal according to the data signal and a predetermined extinction ratio setting value; a second conversion and filter circuit arranged to operably conduct a current-to-voltage conversion and filtering operation on the reference signal to generate a second filtered signal; a second rectifier arranged to operably rectify the second filtered signal to generate a second rectified signal; a rectified signals processing circuit, coupled with the first rectifier and the second rectifier, arranged to operably process the first rectified signal and the second rectified signal to generate a processed signal; and a comparator, coupled with the rectified signals processing circuit and the LD driver circuit, arranged to operably generate a comparison signal based on the processed signal so as to control the LD driver circuit to adjust an amplitude of the driving signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
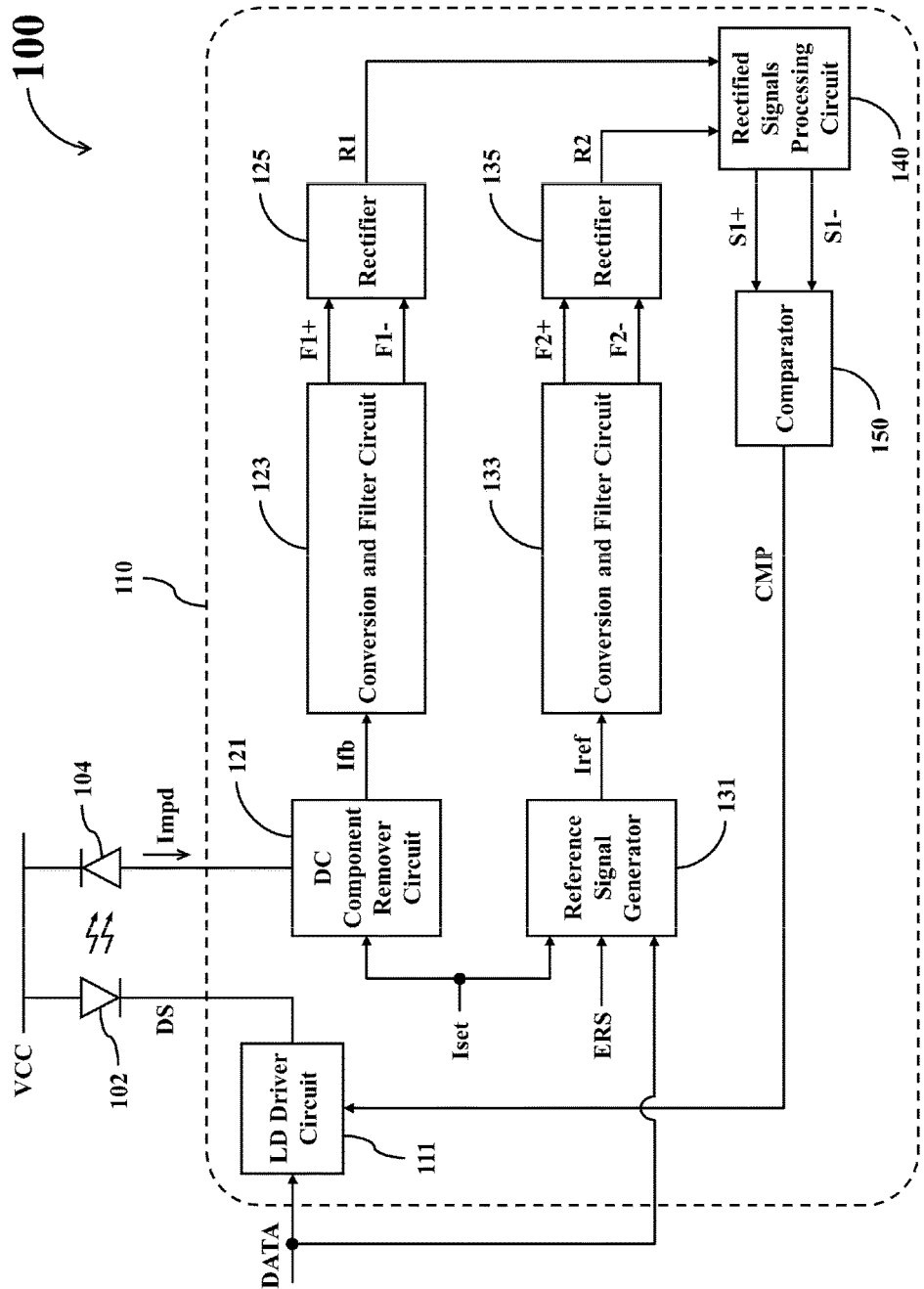
FIG. 1 shows a simplified functional block diagram of an optical transmitter circuit according to one embodiment of the present disclosure.

FIG. 1 shows a simplified functional block diagram of an optical transmitter circuit 100 according to one embodiment of the present disclosure. The optical transmitter circuit 100 can be employed in an optical communication system to transmit data in the format of light pulses to a receiving device through an optical fiber or other suitable transmission medium.

The optical transmitter circuit 100 comprises a laser diode (LD) 102, an optical detection circuit 104, and a LD control circuit 110. The optical detection circuit 104 may be realized with a suitable monitor photo diode (MPD) whose output light density versus input current characteristic curve (i.e., the L-I curve) is much more stable than the LD 102 and only vary slightly (or not vary at all) with aging or temperature changes.

In operations, the LD 102 generate light pulses based on a driving signal DS generated by the LD control circuit 110. The optical detection circuit 104 detects the light generated by the LD 102 and generates a detected signal Impd which is proportional to the amount of light generated by the LD 102. The LD control circuit 110 then adopts a feedback control mechanism to adjust the amplitude of the driving signals DS according to the detected signal DS transmitted from the optical detection circuit 104.

As shown in FIG. 1, the LD control circuit 110 comprises a LD driver circuit 111, a direct current (DC) component remover circuit 121, a first conversion and filter circuit 123, a first rectifier 125, a reference signal generator 131, a second conversion and filter circuit 133, a second rectifier 135, a rectified signals processing circuit 140, and a comparator 150.

The LD driver circuit 111 is coupled with the LD 102, and arranged to operably generate a driving signal DS based on an incoming data signal DATA to drive the LD 102, so that the LD 102 generates corresponding light pulses carrying information of the data signal DATA.

The DC component remover circuit 121 is coupled with the optical detection circuit 104, and arranged to operably remove the DC components from the detected signal Impd to generate a feedback signal Ifb.

The first conversion and filter circuit 123 is coupled with the DC component remover circuit 121, and arranged to operably conduct a current-to-voltage conversion and filtering operation on the feedback signal Ifb to generate a first pair of differential filtered signals F1+ and F1−.

The first rectifier 125 is coupled with the first conversion and filter circuit 123, and arranged to operably rectify the first pair of differential filtered signals F1+ and F1− to generate a first rectified signal R1.

The reference signal generator 131 is arranged to operably generate a reference signal Iref according to the data signal DATA, a predetermined extinction ratio setting value ERS, and a predetermined current setting value Iset, so that the reference signal Iref has a frequency substantially the same as the data signal DATA. The predetermined extinction ratio setting value ERS represents a desired extinction ratio of the LD 102 and the predetermined current setting value Iset represents a desired averaged amount of the current of the detected signal Impd. In practice, both the predetermined extinction ratio setting value ERS and the predetermined current setting value Iset may be configured by a digital signal processor circuit or a micro-processor circuit (not shown) of the optical transmitter circuit 100.

The second conversion and filter circuit 133 is coupled with the reference signal generator 131, and arranged to operably conduct a current-to-voltage conversion and filtering operation on the reference signal Iref to generate a second pair of differential filtered signals F2+ and F2−.

The second rectifier 135 is coupled with the second conversion and filter circuit 133, and arranged to operably rectify the second pair of differential filtered signals F2+ and F2− to generate a second rectified signal R2.

The rectified signals processing circuit 140 is coupled with the first rectifier 125 and the second rectifier 135. The rectified signals processing circuit 140 is arranged to operably process the first rectified signal R1 and the second rectified signal R2 to generate a pair of differential processed signals S1+ and S1−, so that the differential processed signals S1+ and S1− represent the relative magnitude between the amplitude of the feedback signal Ifb and the amplitude of the reference signal Iref.

The comparator 150 is coupled with the rectified signals processing circuit 140 and the LD driver circuit 111. The comparator 150 is arranged to operably compare the relate magnitude of the differential processed signals S1+ and S1− to generate a comparison signal CMP. The resulting comparison signal CMP is then transmitted to the LD driver circuit 111 for instructing the LD driver circuit 111 to adjust the amplitude of the driving signal DS.

Since the differential processed signals S1+ and S1− outputted from the rectified signals processing circuit 140 represent the relative magnitude between the amplitude of the feedback signal Ifb and the amplitude of the reference signal Iref, the parity of the comparison signal CMP would represent the comparison result of the amplitude of the feedback signal Ifb and the amplitude of the reference signal Iref.

In practice, the DC component remover circuit 121 and the reference signal generator 131 may be realized with various suitable circuits. Each of the first conversion and filter circuit 123 and the second conversion and filter circuit 133 may be realized with various circuits capable of conducting the current-to-voltage conversion and filtering operations. Each of the first rectifier 125 and the second rectifier 135 may be realized with various rectifying circuits, such as a suitable half-wave rectifier or full-wave rectifier. The rectified signals processing circuit 140 may be realized with various circuits capable of conducting subtraction and integration operations.

Different functional blocks of the LD control circuit 110 may be realized with separate circuits. Alternatively, all the functional blocks of the LD control circuit 110 may be integrated into a single LD controller IC.

According to the parity of the comparison signal CMP, the LD driver circuit 111 would adjust the amplitude of the driving signal DS. For example, if the parity of the comparison signal CMP shows that the amplitude of the feedback signal Ifb is greater than the amplitude of the reference signal Iref, the LD driver circuit 111 may decrease the current of the driving signal DS. On the contrary, if the parity of the comparison signal CMP shows that the amplitude of the feedback signal Ifb is smaller than the amplitude of the reference signal Iref, the LD driver circuit 111 may increase the current of the driving signal DS.

By adopting the above closed loop feedback control mechanism, the LD control circuit 110 is enabled to maintain the extinction ratio of the LD 102 to a desired value configured by the predetermined extinction ratio setting value ERS by properly adjusting the current of the driving signal DS. In this way, the extinction ratio of the LD 102 can be maintained over temperature or aging of the LD 102, thereby improving the signal quality of the light outputted from the LD 102.

Figure 2:
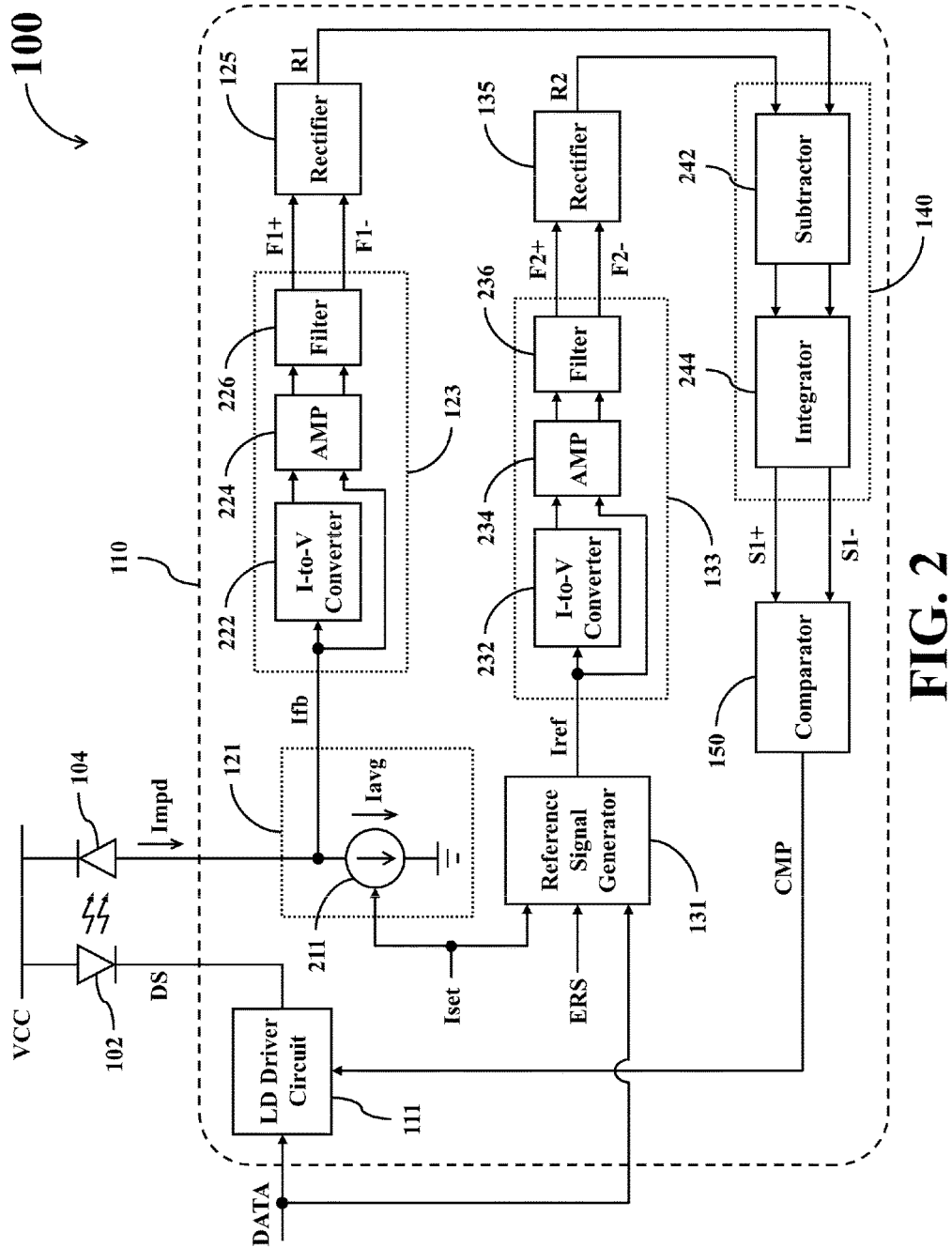
FIGS. 2-3 show simplified functional block diagrams of the optical transmitter circuit of FIG. 1 according to different embodiments of the present disclosure.
Figure 3:
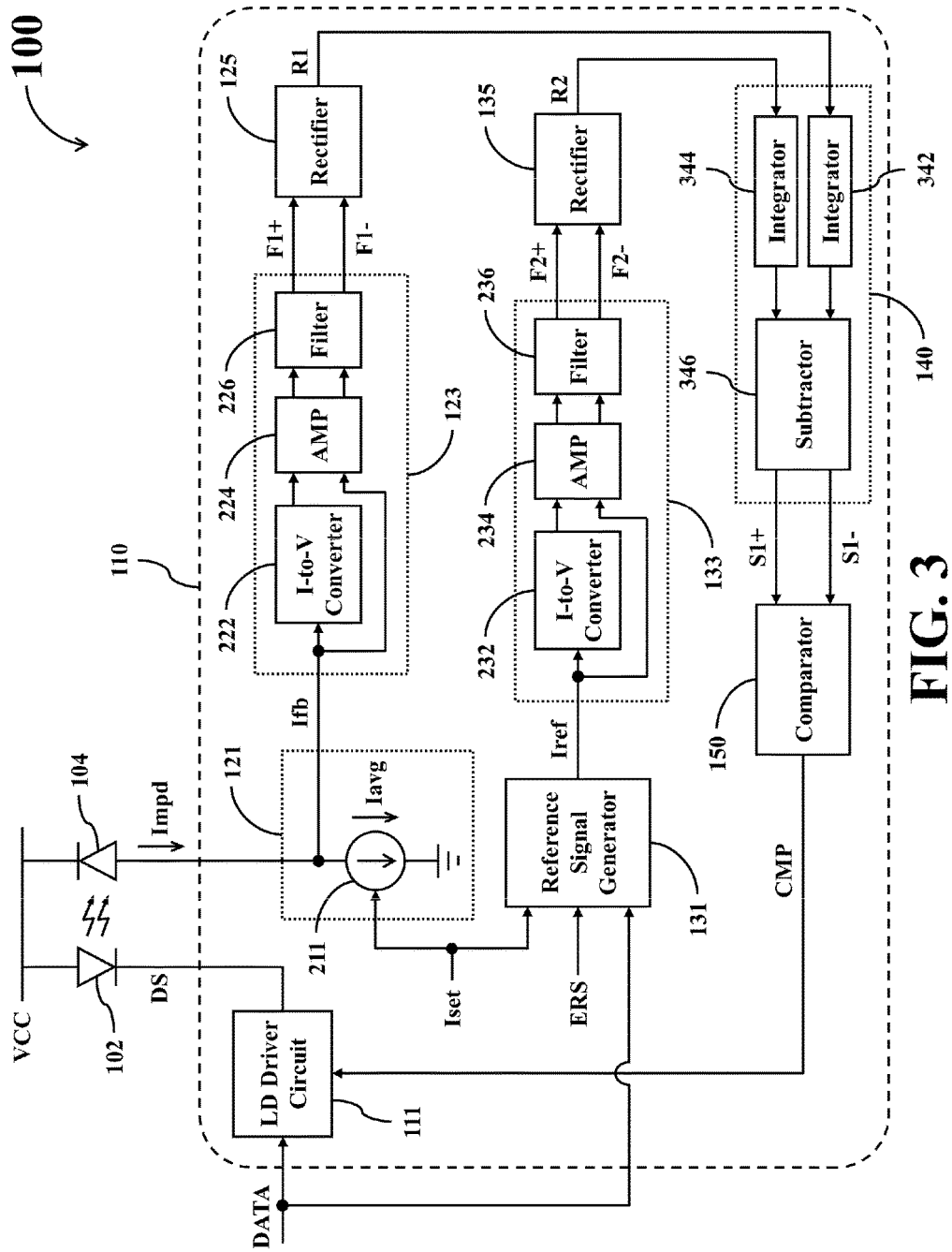

Please refer to FIG. 2 and FIG. 3. FIGS. 2~3 show simplified functional block diagrams of the optical transmitter circuit 100 according to different embodiments of the present disclosure.

As shown in FIG. 2, the DC component remover circuit 121 may comprise a current sink 211 for drawing a predetermined current Iavg from the detected signal Impd under control of the predetermined current setting value Iset, so as to remove the DC components of the detected signal Impd.

In the embodiment of FIG. 2, the first conversion and filter circuit 123 comprises a first I-to-V converter 222, a first amplifier 224, and a first filter 226, while the second conversion and filter circuit 133 comprises a second I-to-V converter 232, a second amplifier 234, and a second filter 236.

In the first conversion and filter circuit 123, the first I-to-V converter 222 is coupled with the DC component remover circuit 121, and arranged to operably conduct a current-to-voltage conversion operation on the feedback signal Ifb to convert the feedback signal Ifb into a voltage signal. The first amplifier 224 is coupled with the first I-to-V converter 222, arranged to operably amplify the voltage signal from the first I-to-V converter 222 to generate a first pair of differential amplified signals. The first filter 226 is coupled with the first amplifier 224, and arranged to operably filter the differential amplified signals outputted from the first amplifier 224 to generate the first pair of differential filtered signals F1+ and F1−.

In the second conversion and filter circuit 133, the second I-to-V converter 232 is coupled with the reference signal generator 131, and arranged to operably conduct a current-to-voltage conversion operation on the reference signal Iref to convert the reference signal Iref into a voltage signal. The second amplifier 234 is coupled with the second I-to-V converter 232, and arranged to operably amplify the voltage signal from the second I-to-V converter 232 to generate a second pair of differential amplified signals. The second filter 236 is coupled with the second amplifier 234, and arranged to operably filter the differential amplified signals outputted from the second amplifier 234 to generate the second pair of differential filtered signals F2+ and F2−.

In practice, each of the first I-to-V converter 222 and the second I-to-V converter 232 may be realized with a suitable transimpedence amplifier. Each of the first filter 226 and the second filter 236 may be realized with various suitable band-pass filters or low-pass filters.

As shown in FIG. 2, the rectified signals processing circuit 140 of this embodiment comprises a subtractor 242 and an integrator 244.

The subtractor 242 is coupled with the first rectifier 125 and the second rectifier 135, and arranged to operably subtract either one of the first and second rectified signals R1 and R2 from another one. The integrator 244 is coupled with the subtractor 242, and arranged to operably conduct an integration operation on the subtraction result of the subtractor 242 to generate the differential processed signals S1+ and S1−.

With the operation of the rectified signals processing circuit 140, the influence caused by the phase difference between the first and second rectified signals R1 and R2 can be effectively reduced, thereby improving the accuracy of above closed loop feedback control of the extinction ratio of the LD 102.

In the embodiment of FIG. 3, the rectified signals processing circuit 140 comprises a first integrator 342, a second integrator 344, and a subtractor 346.

The first integrator 342 is coupled with the first rectifier 125, and arranged to operably conduct an integration operation on the first rectified signal R1 to generate a first integration signal. The second integrator 344 is coupled with the second rectifier 135, and arranged to operably conduct an integration operation on the second rectified signal R2 to generate a second integration signal. The subtractor 346 is coupled with the first integrator 342 and the second integrator 344, and arranged to operably subtract either one of the first and second integration signals from another one to generate the differential processed signals S1+ and S1−.

Similar to the embodiment of FIG. 2, the rectified signals processing circuit 140 of FIG. 3 can also mitigate the influence caused by the phase difference between the first and second rectified signals R1 and R2. In this way, the accuracy of above closed loop feedback control of the extinction ratio of the LD 102 can also be effectively improved.

In some embodiments, the rectified signals processing circuit 140 may be realized with a suitable low-pass filter having differential outputs structure or a suitable band-pass filter having differential outputs structure.

Additionally, some functional blocks having differential output structure, such as the first conversion and filter circuit 123, the second conversion and filter circuit 133, the rectified signals processing circuit 140, the first amplifier 224, the first filter 226, the second amplifier 234, and the second filter 236, may be instead realized with suitable circuits having a single-ended output structure. In this situation, some corresponding functional blocks having differential input structure, such as the first rectifier 125, the second rectifier 135, the rectified signals processing circuit 140, the first amplifier 224, the first filter 226, the second amplifier 234, and the second filter 236, and the comparator 150, may be instead realized with suitable circuits having a single-ended input structure.

It can be appreciated from the foregoing descriptions, the LD control circuit 110 is enabled to maintain the extinction ratio of the LD 102 to a desired value by adopting the above feedback control loop formed by the LD driver circuit 111, the DC component remover circuit 121, the first conversion and filter circuit 123, the first rectifier 125, the reference signal generator 131, the second conversion and filter circuit 133, the second rectifier 135, the rectified signals processing circuit 140, and the comparator 150. In this way, the extinction ratio of the LD 102 can be maintained over temperature or aging of the LD 102, thereby improving the signal quality of the light outputted from the LD 102.

In addition, the influence caused by the phase difference between the first and second rectified signals R1 and R2 can be effectively reduced due to the operation of the rectified signals processing circuit 140. As a result, the accuracy of controlling the extinction ratio of the LD 102 can be further improved.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A laser diode (LD) control circuit (110), comprising:
   a LD driver circuit (111) arranged to operably generate a driving signal (DS) for driving a laser diode (102) based on a data signal (DATA);
   a direct current (DC) component remover circuit (121) arranged to operably remove DC components from a detected signal (Impd) to generate a feedback signal (Ifb), wherein the detected signal (Impd) is generated by an optical detection circuit (104) and proportional to an amount of light generated by the laser diode (102);
   a first conversion and filter circuit (123) arranged to operably conduct a current-to-voltage conversion and filtering operation on the feedback signal (Ifb) to generate a filtered signal (F1+; F1−);
   a first rectifier (125) arranged to operably rectify the filtered signal (F1+; F1−) to generate a first rectified signal (R1);
   a reference signal generator (131) arranged to operably generate a reference signal (Iref) according to the data signal (DATA) and a predetermined extinction ratio setting value (ERS);
   a second conversion and filter circuit (133) arranged to operably conduct a current-to-voltage conversion and filtering operation on the reference signal (Iref) to generate a second filtered signal (F2+; F2−);
   a second rectifier (135) arranged to operably rectify the second filtered signal (F2+; F2−) to generate a second rectified signal (R2);
   a rectified signals processing circuit (140), coupled with the first rectifier (125) and the second rectifier (135), arranged to operably process the first rectified signal (R1) and the second rectified signal (R2) to generate a processed signal (S1+; S1−); and
   a comparator (150), coupled with the rectified signals processing circuit (140) and the LD driver circuit (111), arranged to operably generate a comparison signal (CMP) based on the processed signal (S1+; S1−) so as to control the LD driver circuit (111) to adjust an amplitude of the driving signal (DS).

2. The LD control circuit (110) of claim 1, wherein a parity of the comparison signal (CMP) represents a relative magnitude between an amplitude of the feedback signal (Ifb) and an amplitude of the reference signal (Iref).

3. The LD control circuit (110) of claim 2, wherein the first conversion and filter circuit (123) comprises:
   a first I-to-V converter (222) arranged to operably convert the feedback signal (Ifb) into a voltage signal;
   a first amplifier (224), coupled with the first I-to-V converter (222), arranged to operably amplify the voltage signal from the first I-to-V converter (222) to generate a first amplified signal; and a first filter (226), coupled with the first amplifier (224), arranged to operably filter the first amplified signal from the first amplifier (224) to generate the first filtered signal (F1+; F1−);

wherein the second conversion and filter circuit (133) comprises:

a second I-to-V converter (232) arranged to operably convert the reference signal (Iref) into a voltage signal;

a second amplifier (234), coupled with the second I-to-V converter (232), arranged to operably amplify the voltage signal from the second I-to-V converter (232) to generate a second amplified signal; and a second filter (236), coupled with the second amplifier (234), arranged to operably filter the second amplified signal from the second amplifier (234) to generate the second filtered signal (F2+; F2−).

4. The LD control circuit (110) of claim 2, wherein the rectified signals processing circuit (140) comprises:

a subtractor (242), coupled with the first rectifier (125) and the second rectifier (135), arranged to operably subtract either one of the first and second rectified signals (R1, R2) from another one; and an integrator (244), coupled with the subtractor (242), arranged to operably conduct an integration operation on a subtraction result of the subtractor (242) to generate the processed signal (S1+; S1−).

5. The LD control circuit (110) of claim 2, wherein the rectified signals processing circuit (140) comprises:

a first integrator (342), coupled with the first rectifier (125), arranged to operably conduct an integration operation on the first rectified signal (R1) to generate a first integration signal;

a second integrator (344), coupled with the second rectifier (135), arranged to operably conduct an integration operation on the second rectified signal (R2) to generate a second integration signal; and a subtractor (346), coupled with the first integrator (342) and the second integrator (344), arranged to operably subtract either one of the first and second integration signals from another one to generate the processed signal (S1+; S1−).

6. The LD control circuit (110) of claim 2, wherein the rectified signals processing circuit (140) comprises a filter.

7. The LD control circuit (110) of claim 2, wherein the reference signal generator (131) is arranged to operably generate the reference signal (Iref) according to the data signal (DATA), the predetermined extinction ratio setting value (ERS), and a predetermined current setting value (Iset).

* * * * *